United States Patent [19]

Sterns

[11] Patent Number: 4,942,376

[45] Date of Patent: Jul. 17, 1990

[54] TUBULAR MICROWAVE PHASE SHIFTER

[75] Inventor: William G. Sterns, Canoga Park, Calif.

[73] Assignee: ITT Corporation, New York, N.Y.

[21] Appl. No.: 311,793

[22] Filed: Feb. 17, 1989

[51] Int. Cl.[5] .............................................. H10P 1/18

[52] U.S. Cl. .................................... 333/160; 333/161; 333/156

[58] Field of Search ............... 333/261, 246, 161, 160, 333/156, 162; 343/700 MS

[56] References Cited

U.S. PATENT DOCUMENTS 4,516,097 5/1985 Munson et al. ..................... 333/261
4,602,227 7/1986 Clark et al. ..................... 333/160 X

FOREIGN PATENT DOCUMENTS 0581920 8/1959 Canada ............................... 333/160
0123105 7/1985 Japan ................................. 333/161

*Primary Examiner*—Eugene R. Laroche
*Assistant Examiner*—Seung Ham
*Attorney, Agent, or Firm*—Thomas N. Twomey

[57] ABSTRACT

The present invention constitutes a microwave circuit structure such as a phase shifter which has a dielectric cylindrical support structure with a ground plane on the inside and a microwave circuit mounted on the outside. A cylindrical shield is mounted coaxially around the circuit, spaced therefrom by a second dielectric.

Two embodiments are shown in microstrip and stripline.

6 Claims, 2 Drawing Sheets

TUBULAR MICROWAVE PHASE SHIFTER

BACKGROUND OF THE INVENTION

1. Field of the Invention

The subject of the invention relates generally to microwave circuits such as phase shifters and more particularly to ones mounted on a cylindrical support.

2. Description of the Prior Art

Prior art microwave phase shifters are on linear boards and are mounted in a box where metal elements provide structural support.

Also in the prior art, there are several nonplanar printed circuits such as that shown in U.S. Pat. No. 2,611,040, Brunetti, which prints a circuit around a cylindrical electron tube. Similar U.S. Pat. Nos. are 2,720,578, Caffiaux et al. and 2,772,380, Andrew.

U.S. Pat. No. 3,080,541, Parker, shows a printed circuit coil structure which may be mounted on a cone or cylinder with support by a metallic base member. U.S. Pat. No. 3,755,891, Muckelroy et al., illustrates a three-dimensional circuit module for thick film circuits involving both printing inside and outside the walls of a hollow cylindrical substrate formed of a dielectric coating on a cylindrical housing.

U.S. Pat. No. 4,399,488, Ruwe et al., involves the packaging of microelectronics using a series of various size cylinders assembled and sealed from the environment with connections out opposite ends of the cylinders.

U.S. Pat. No. 4,412,272, Wedertz et al., shows a flexible printed circuit board with components mounted thereon which may be rolled into a spiral. U.S. Pat. No. 4,510,551, Brainard, discloses a memory module constructed in a compact cylindrical form with individual integrated circuit memory components interconnected by a flexible printed circuit which is rolled and inserted in a protective outer casing, also cylindrical. U.S. Pat. No. 4,528,748, Eichelberger et al., discloses a method for batch fabricating flat printed circuit boards and subsequently forming them to a particular shape such as a hexagon cylinder.

The above art does not disclose the use of a dielectric cylinder for structural support, nor a microwave application.

SUMMARY OF THE INVENTION

The general object of the present invention is to provide a tubular microwave phase shifter having a dielectric support structure with a cylindrical ground plane on the inside and a microwave circuit mounted on the outside. A cylindrical shield is mounted coaxially around the circuit, spaced therefrom by a second dielectric.

It is an object of the present invention to replace a flat circuit in the closely spaced area between radiators in a scanning array antenna with a cylindrical microstrip or stripline microwave phase shifter such that the phase shifter will take less space between radiation elements in the antenna array.

Another object is to provide such a tubular microwave phase shifter which uses a dielectric support and is of lighter weight.

Another object is to reduce the cost of microwave phase shifters by simplifying the design, and reducing manufacturing costs of the required housing.

Other objects and advantages of the invention will become apparent from the specific embodiments described hereinafter.

DESCRIPTION OF THE PREFERRED EMBODIMENTS

Figure 1:
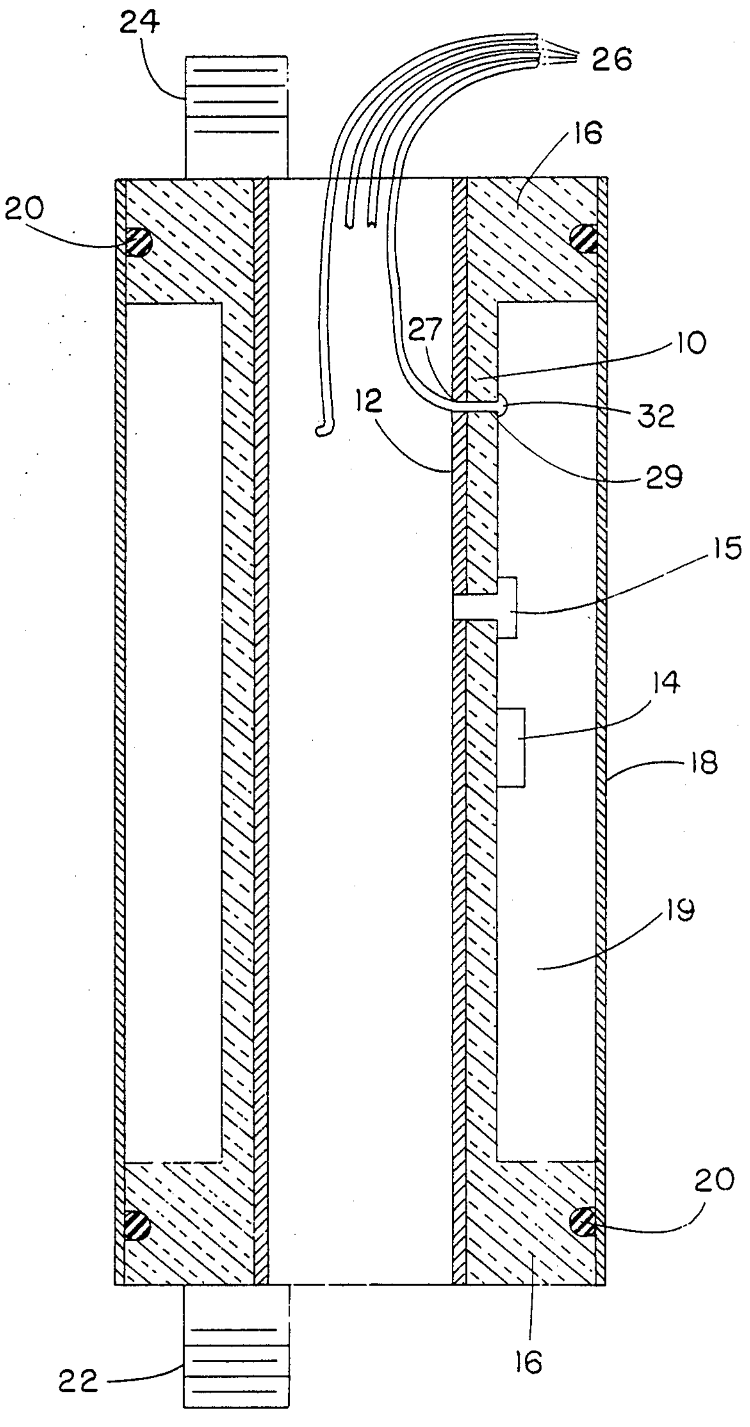
FIG. 1 is a cross-section of a tubular microwave phase shifter employing microstrip.

Turning now to the drawings, wherein there is disclosed a novel tubular microwave phase shifter realizable in microstrip or stripline, FIG. 1 represents a microstrip embodiment. For given linear dimension between radiators on a scanning array antenna, the available circuit area increases by a factor of $\pi$ due to the fact that the circuit is cylindrical. The dielectric wall 10 is the structural member negating the requirement for heavy metal walls. A thin low loss metal coating is deposited on all surfaces of the cylinder 10 by well known processes, such as vacuum deposition and/or electroplating. The ground plane 12 is on the inside of the cylinder 10, and a microwave circuit 14 is contained on the outside of the cylinder 10. A diode 15 may go through the cylinder 10 from the ground plane 12 to the microwave circuit plane on the outside of the cylinder 10 or may be connected in series between elements of the microwave circuit. The cylinder 10 is shaped in the form of a spool with end portions 16 upon which a cylindrical metal shield 18 is placed which could be attached by heat shrinking. A dielectric 19 which may be air or foam is contained between the microwave circuit 14 and the shield 18. O-rings 20 may be contained between the ends 16 of the spool and the cylinder 18. Input lead 22 and output R.F. lead 24 may go through the end portion 16 to the microwave circuit, and bias wires 26 down through the center of the spool 10 and through holes 27 in ground plane 12 and 29 in cylinder 10 to the bias points 32 shown in FIG. 2 for example.

The technique is particularly suited for complex microwave circuits such as diode phase shifters, but it is applicable to any microstrip line, or stripline device operating in the TEM or quasi TEM mode of propagation. The basic concept is to print the microwave circuit on a cylindrical support rather than a planar surface and use the dielectric element for support. Heavy metal walls are not then required and the necessary housing is greatly simplified. Beryllium oxide dielectric may be used for the spool 10, but any dimensionally stable low loss dielectric can be employed. Beryllium oxide may be 99.5% pure with a very low loss tangent. The dielectric constant is 6.1. Cylindrical shapes can be readily extruded and ground to near arbitrary tolerances to ensure constant dielectric thickness that is required for R.F. circuit performance and reproductibility.

Figure 2:
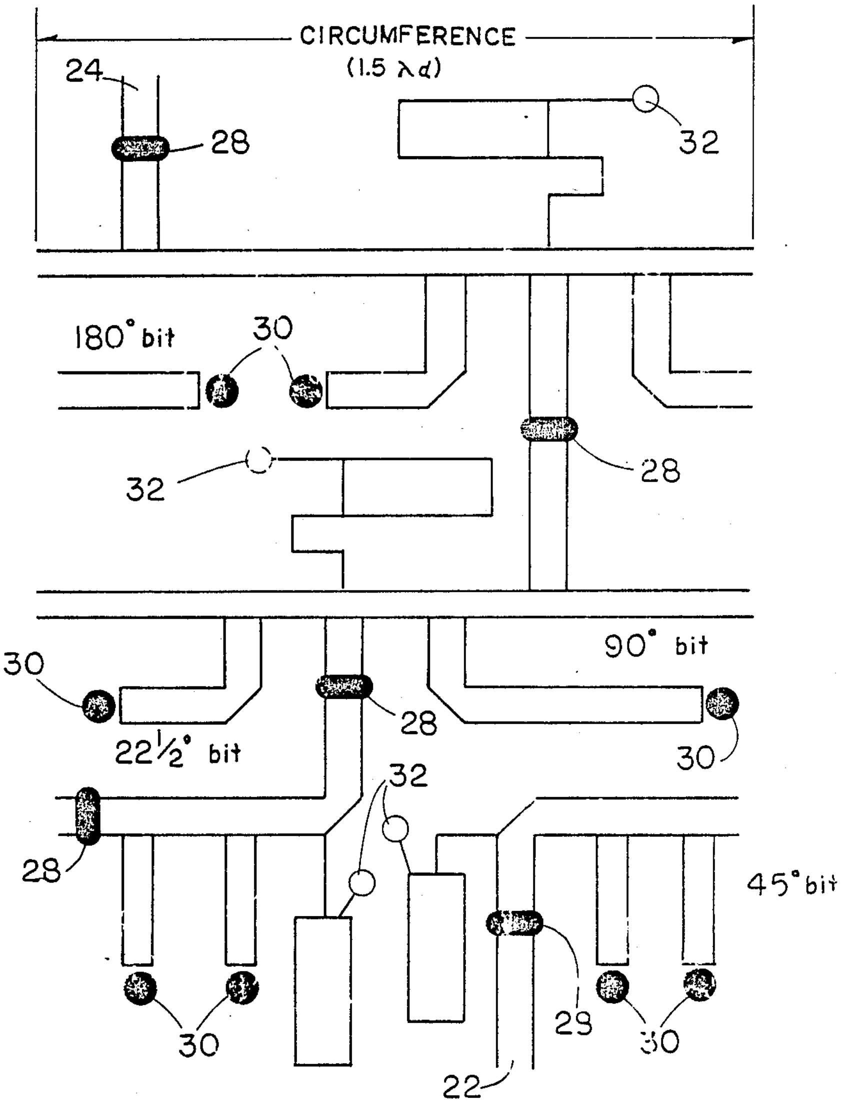
FIG. 2 is a circuit pattern developed into a planar surface for a four-bit C-band phase shifter which might be employed in the embodiment of FIG. 1.

Turning now to FIG. 2, there is illustrated a circuit pattern developed by unrolling the cylindrical circuit to a flat surface for an application involving a four-bit C-band phase shifter using the above mentioned beryllium oxide dielectric and the structure of FIG. 1. The microwave circuit of FIG. 2 would be printed on the outside of the spool 10 as shown at 14 and 15 in FIG. 1.

The solid shaded rectangular elements 28 are capacitors. The solid shaded circular elements 30 are diodes, and the hollow circular elements 32 are bias connections. The remainder of FIG. 2 illustrates the microstrip structure. The circumference of the printed circuit can be made 1.5 $\lambda_d$, that required for a ring hybrid where $\lambda_d$ is the wavelength at the operating frequency for the dielectric. For beryllium oxide the diameter would be about 0.45 inches at C-band. The thickness of the dielectric is determined by the desired microwave trace line widths and would be about 0.06 inches for beryllium oxide. The velocity of propagation will be slightly different between longitudinal and radial traces. The line widths and lengths will have to be adjusted accordingly. The microwave device described is a diode phase shifter, but as noted above the technique is suited for any microwave printed circuit elements or network. The beryllium oxide dielectric provides a much lighter weight support than a metallic support, and when used in a scanning array antenna application, in the large numbers involved, this can make a substantial difference in the weight of the overall antenna. After the circuit of FIG. 2 is assembled and tested, the thin wall shield 18 of FIG. 1 can be placed over it either by heat shrinking, as previously mentioned, or securing by solder or adhesive. In FIG. 2 the 90° and 180° bits are ring hybrids, and the 22.5° and 45° bits are loaded line elements. The simplified housing and assembly techniques will also result in substantially reduced production costs.

Figure 3:
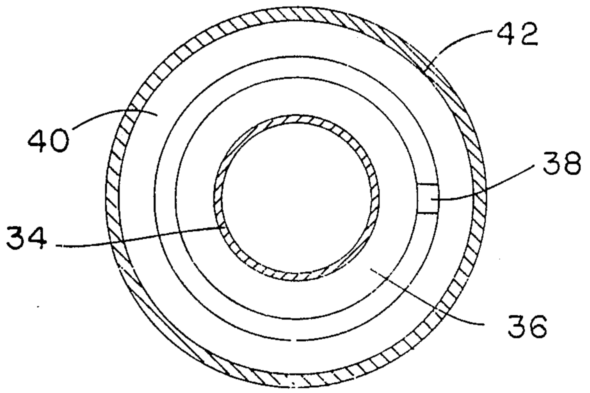
FIG. 3 is a top view of the various layers of a stripline embodiment of the tubular microwave phase shifter.

Turning now to FIG. 3, a stripline configuration of the tubular microwave phase shifter is illustrated in the layer diagram looking down from the top. A ground plane 34 is contained on the inside of the cylindrical dielectric 36. The stripline 38 is on the outside of the dielectric 36. A second dielectric 40 is contained between the stripline 38 and the shield 42. The dielectrics 36 and 40 may be a low loss dielectric such as a cross linked styrene copolymer, such as Rexolite 1422, a brand name of Brand-Rex Division of American Enka Corp.

From the foregoing description various modifications within the scope and spirit of the invention will suggest themselves to those skilled in the art. Accordingly, it is not intended that the scope of the invention should be limited by the drawings or the specifics of the description, these being intended to be typical and illustrative only.

What is claimed as new and desired to be secured by letters patent of the United States is:

1. A microwave circuit structure having a support structure in the shape of a light weight dielectric cylinder, a cylindrical ground plane on the inside of said dielectric cylinder, a microstrip phase shifter circuit on the outside of said dielectric cylinder, and a cylindrical shield mounted coaxially around the circuit spaced therefrom by a second dielectric.

2. The structure of claim 1 wherein said dielectric cylinder is of beryllium-oxide.

3. The structure of claim 2 wherein said dielectric cylinder is in the shape of a spool having end portions from which said shield may be mounted.

4. The structure of claim 3 wherein said shield is mounted by heat shrinking it on said end portions.

5. A microwave circuit structure having a support structure in the shape of a lightweight dielectric cylinder, a cylindrical ground plane on the inside of said dielectric cylinder, a strip line phase shifter circuit on the outside of said dielectric cylinder, and a cylindrical shield mounted coaxially around the circuit spaced therefrom by a second dielectric.

6. The structure of claim 5 in which both said dielectric cylinder and said second dielectric are of a low loss dielectric of cross linked styrene copolymer.

* * * * *